(12) United States Patent
Amano et al.

(10) Patent No.: US 8,456,065 B2
(45) Date of Patent: Jun. 4, 2013

(54) STIFFNESS-ENHANCED SURFACE-MOUNTED PIEZOELECTRIC DEVICES

(75) Inventors: Yoshiaki Amano, Saitama (JP); Takefumi Saito, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 397 days.

(21) Appl. No.: 12/880,742

(22) Filed: Sep. 13, 2010

(65) Prior Publication Data

US 2011/0062831 A1     Mar. 17, 2011

(30) Foreign Application Priority Data

Sep. 16, 2009 (JP) ................... 2009-213959
Mar. 25, 2010 (JP) ................... 2010-069442

(51) Int. Cl.
*H03H 9/21* (2006.01)
(52) U.S. Cl.
USPC .................... 310/344; 310/370; 310/348
(58) Field of Classification Search
CPC .................................. H01L 41/053
USPC .................... 310/340, 344, 370
See application file for complete search history.

(56) References Cited

U.S. PATENT DOCUMENTS

| | | | |
|---|---|---|---|
| 7,984,536 B2* | 7/2011 | Takahashi | 29/25.35 |
| 8,053,952 B2* | 11/2011 | Takahashi | 310/344 |
| 8,212,454 B2* | 7/2012 | Onitsuka et al. | 310/348 |
| 2003/0168943 A1* | 9/2003 | Matsuyama et al. | 310/344 |
| 2009/0015106 A1* | 1/2009 | Tanaya | 310/344 |
| 2010/0148634 A1* | 6/2010 | Ichikawa | 310/348 |
| 2011/0164473 A1* | 7/2011 | Onitsuka et al. | 368/47 |
| 2011/0221309 A1* | 9/2011 | Umeki | 310/344 |
| 2012/0043859 A1* | 2/2012 | Ichikawa et al. | 310/344 |

FOREIGN PATENT DOCUMENTS

| | | |
|---|---|---|
| JP | H02-235360 | 9/1990 |
| JP | H03-236264 | 10/1991 |
| JP | H10-028024 | 1/1998 |
| JP | 2000-223995 | 8/2000 |
| JP | 2007-067788 | 3/2007 |
| JP | 2008-118241 | 5/2008 |
| JP | 2008-298205 | 12/2008 |
| JP | 2009-164775 | 7/2009 |
| JP | 2011049665 A * | 3/2011 |

OTHER PUBLICATIONS

Office Action for related Japanese Patent Application No. 2010-069442, 2 pages, date unknown.

* cited by examiner

*Primary Examiner* — J. San Martin
(74) *Attorney, Agent, or Firm* — Klarquist Sparkman, LLP

(57) ABSTRACT

Surface-mounted piezoelectric devices are disclosed, of which an exemplary device includes a tuning-fork type piezoelectric vibrating piece having a base portion and a pair of vibrating arms extending from the base portion. The device includes a package defined by a wall. The package includes a cavity accommodating the tuning-fork type piezoelectric vibrating piece and at least one columnar body situated between the vibrating arms in the cavity.

18 Claims, 10 Drawing Sheets

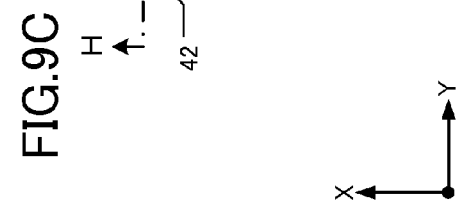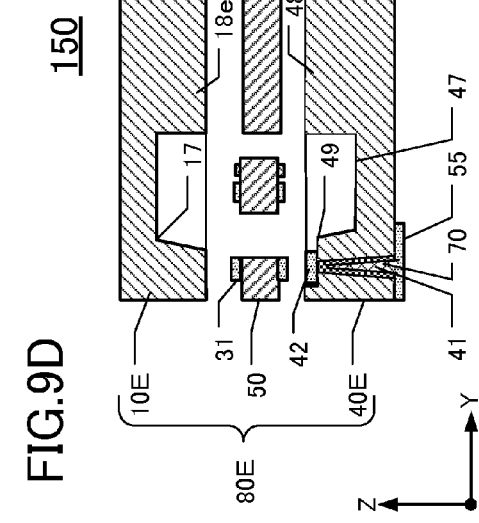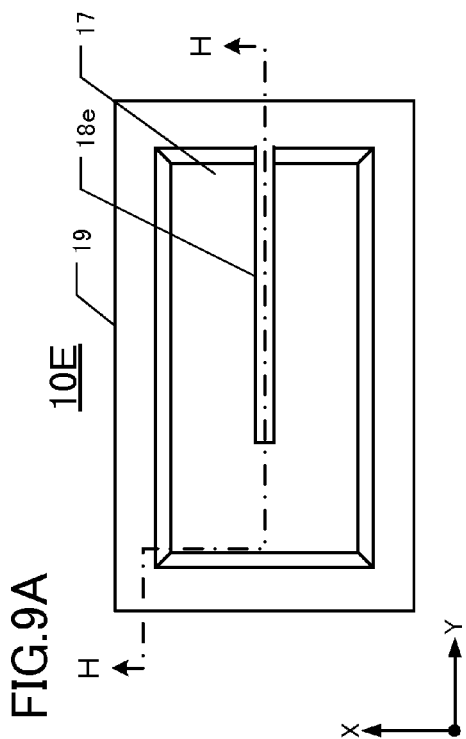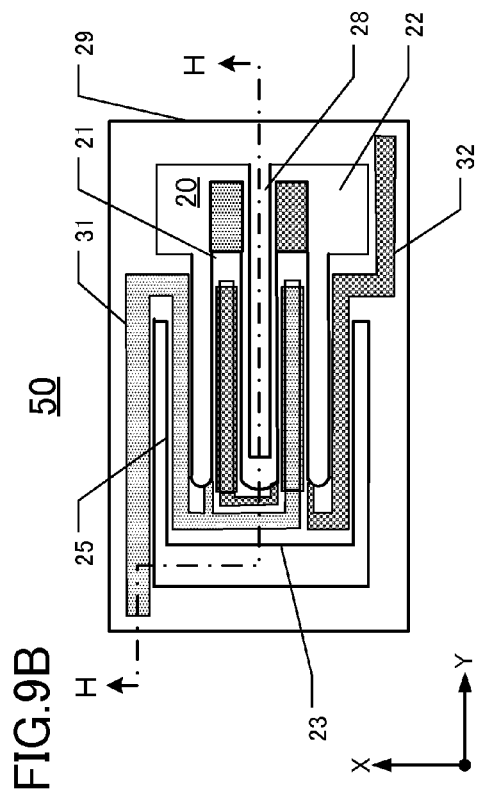

STIFFNESS-ENHANCED SURFACE-MOUNTED PIEZOELECTRIC DEVICES

CROSS-REFERENCE TO RELATED APPLICATION

This application claims priority to and the benefit of Japan Patent Application No. 2009-213959, filed on Sep. 16, 2009, and Japan Patent Application No. 2010-069442 filed on Mar. 25, 2010, in the Japan Patent Office, the disclosures of which are incorporated herein by reference in their respective entireties.

FIELD

This disclosure relates to, inter alia, surface-mounted piezoelectric devices exhibiting reduced warpage or deflection.

DESCRIPTION OF THE RELATED ART

With the progress of miniaturization and/or increases in the operating frequency of mobile communication apparatus and office automation (OA) equipment, piezoelectric devices used in this equipment must be progressively smaller. Generally, surface-mounted piezoelectric devices have a configuration in which a piezoelectric vibrating piece is placed in a package made of an insulating material, such as ceramic. The top of the package is sealed using a panel made of a metal such as KOVAR (a nickel-cobalt ferrous alloy developed by Carpenter Technology Corporation to have thermal expansion characteristics compatible with those of borosilicate glass).

Nowadays, for mass-production, methods have been proposed for manufacturing multiple surface-mounted piezoelectric devices simultaneously using wafer substrates made of crystal (quartz crystal) or glass. For example, a piezoelectric device as disclosed in Japan Unexamined Patent Application No. 2009-164775 comprises a lid and a base made of quartz crystal.

However, panels made of crystal or glass exhibit less elastic deformation compared to panels made of metal, such as KOVAR. Consequently, there is an increased probability of fracture of panels made of crystal or glass, particularly whenever a large external pressure is applied to the panel. Also, as miniaturization of surface-mounted piezoelectric devices has progressed, panels thereof made of ceramic, crystal, or glass have had to be made progressively thinner, which renders them more deformable when exposed to external pressure. That is, there is an increased probability of warpage or deflection of the panels (and thus of the devices) due to their reduced thickness resulting from miniaturization.

The invention disclosed below provides, inter alia, surface-mounted piezoelectric devices that exhibit reduced warpage or deflection otherwise caused by reduced thickness of the piezoelectric devices.

SUMMARY

According to a first aspect, surface-mounted piezoelectric devices are provided.

An exemplary embodiment comprises a tuning-fork type piezoelectric vibrating piece having a base portion and a pair of vibrating arms extending from the base portion. The tuning-fork type piezoelectric vibrating piece is enclosed in a cavity formed by a package comprising at least one wall. A columnar body is situated between the vibrating arms in the cavity and provides support to the at least one wall. Thus, the columnar body in the cavity suppresses package warpage that otherwise may occur due to the thinner profile of the package.

Another embodiment of a surface-mounted piezoelectric device comprises a tuning-fork type piezoelectric vibrating piece having a base portion and a pair of vibrating arms extending from the base portion. The tuning-fork type piezoelectric vibrating piece is enclosed in a cavity formed by a package comprising at least one wall. The package includes a columnar body situated in the cavity but outboard of the vibrating arms, between the base portion and the distal ends of the vibrating arms in the cavity.

The columnar body can have an elongated shape extending along the vibrating arms. The width of the columnar body, in the direction normal to the direction in which the vibrating arms extend, is narrower nearer the distal ends of the vibrating arms and is wider nearer the base portion. In some embodiments the columnar body extends from the wall of the package.

The package can comprise a base supporting the tuning-fork type piezoelectric vibrating piece and a lid bonded to the base. The base and/or the lid can provide the wall noted above. In such a package, the columnar body can comprise a first columnar member projecting from the base and a second columnar member projecting from the lid. A gap can be situated between the first columnar member and the second columnar member, but in other embodiments the first and second columnar members are bonded together.

The package can comprise a vibrating-arm frame surrounding the tuning-fork type piezoelectric vibrating piece, a base bonded to one surface of the frame, and a lid bonded to another surface of the frame. The columnar body can have a first columnar member projecting from the base, a second columnar member projecting from the lid, and a third columnar member projecting from the frame. In some embodiments respective clearances can be provided between the first columnar member and the third columnar member, and between the second columnar member and the third columnar member. In other embodiments these columnar members can be bonded together.

The various embodiments described herein provide piezoelectric devices that resist deflection more than conventional devices and that have enhanced package strength.

BRIEF DESCRIPTION OF THE DRAWINGS

FIG. 9A is a plan view of the inner surface of a lid used in packaging a tuning-fork type crystal vibrating piece according to a sixth embodiment.

FIG. 9B is a plan (top) view of an embodiment of a tuning-fork type crystal vibrating piece situated in and surrounded by a crystal frame.

FIG. 9C is a plan view of another embodiment of a package base.

FIG. 9D is an elevational section, along the line H-H in FIG. 9C, showing that the base, crystal frame, and lid are co-aligned with each other but have not yet been bonded together.

DETAILED DESCRIPTION

The invention is described below with reference to various embodiments that are not to be regarded as limiting in any way.

First Embodiment of Piezoelectric Device

Figure 1A:
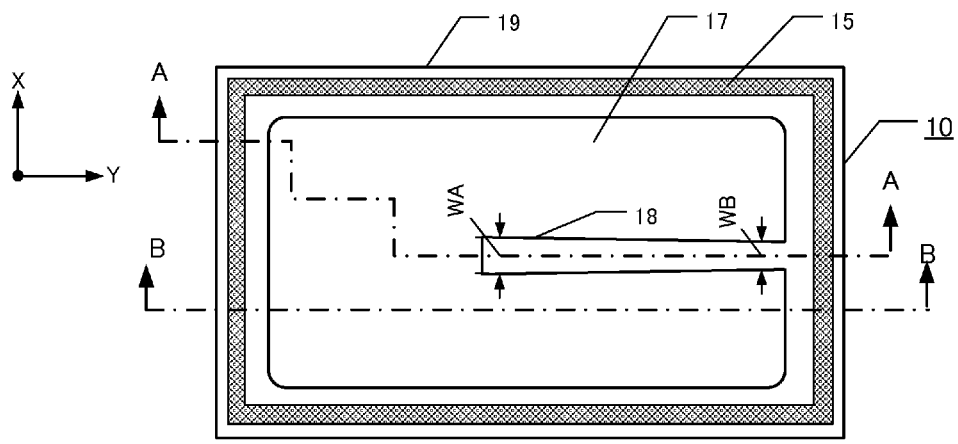
FIG. 1A is a plan view of the inner surface of a lid of a first embodiment of a piezoelectric vibrating device.
Figure 1B:
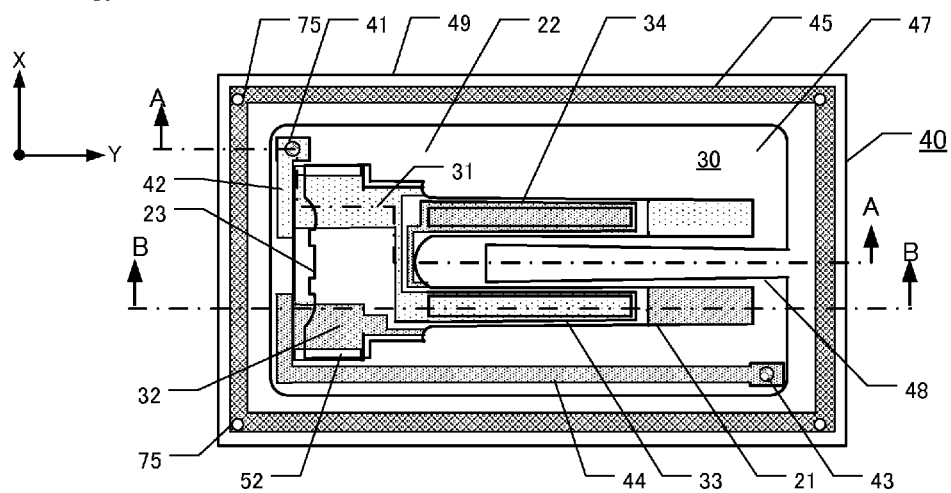
FIG. 1B is a plan view of the inner surface of a base on which a tuning-fork type crystal vibrating piece has been mounted.
Figure 1C:
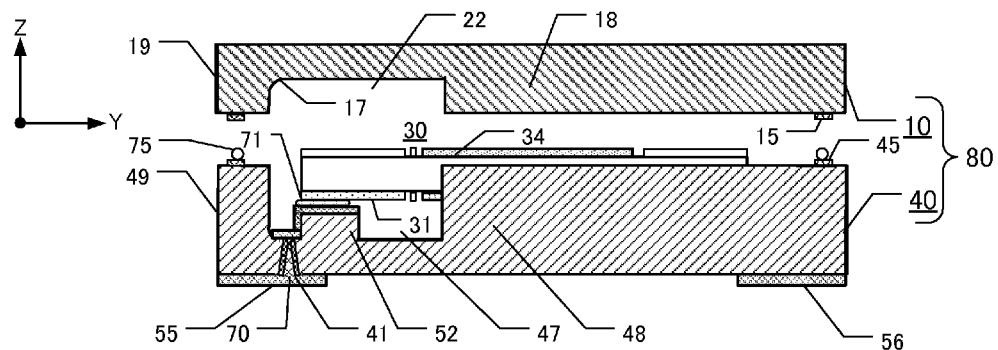
FIG. 1C is an elevational section along the line A-A in FIGS. 1A and 1B, showing the base and lid co-aligned (but vertically separated from each other) for subsequent bonding.

FIGS. 1A-1C are schematic depictions of this embodiment of a surface-mounted piezoelectric device 100 comprising a tuning-fork type crystal vibrating piece 30. FIG. 1A is a plan view of the inner surface of a package lid 10. FIG. 1B is a plan view of a package base 40 on which a tuning-fork type crystal vibrating piece 30 is mounted. FIG. 1C is an elevational section along the line A-A in FIGS. 1A and 1B, with the lid 10 and base 40 being shown vertically separated from each other. The piezoelectric device 100 comprises the lid 10 and base 40, which together form a package 80. The lid 10 and base 40 are made of glass or quartz crystal.

As shown in FIG. 1A, the inner surface of the lid 10 defines a lid concavity 17 and a lid columnar member 18, both facing the base 40 in the package. The lid concavity 17 and lid columnar member 18 are formed by etching or sand-blasting. The width WB (+Y-axis side, right side in FIG. 1A) of the lid columnar member 18 is less than the width WA (−Y-axis side, left side in FIG. 1A). This configuration of the lid columnar member 18 ensures that the distal ends (+Y-axis side, right side in FIG. 1A) of the vibrating arms 21 do not collide with the lid columnar member 18 when the vibrating arms 21 are oscillating. In other words, the range of displacement of the vibrating arms 21 in the X-axis direction at their distal ends (+Y-axis side, right side of FIG. 1A) while vibrating is greater than the range at the roots of the vibrating arms 21. Thus, the lid columnar member 18 is configured in accordance with these ranges of oscillation. The lid columnar member 18 extends along the Y-axis center-line of the lid 10 (or of a cavity 22, which will be discussed later).

The depth of the lid concavity 17 (in the Z-direction) is about 60 μm, for example. During formation of the lid concavity 17, an edge wall 19 of the lid 10 is also formed. The edge wall 19 extends around the periphery of the lid 10. The "height" (in the Z-axis direction) of the edge wall 19 is equal to the height (in the Z-axis direction) of the lid columnar member 18. Adjacent the edge wall 19 is a bonding film 15 that extends around the periphery of the lid and faces the base 40. The bonding film 15 comprises a gold (Au) layer having a thickness of 400 Å to 2000 Å.

As shown in FIG. 1B, the base 40 has an inner surface that defines a base concavity 47, a pair of mounts 52, and a base columnar member 48 that extends toward the lid 10 in the package. The base concavity 47, mounts 52, and base columnar member 48 are formed by etching or sand-blasting. The base concavity 47 has a depth of about 80 μm by etching, thus forming a peripheral edge wall 49. The base columnar member 48 extends from the wall 49 and has the same height (in the Z-axis direction) as the wall. Also formed on the base 40 are a first through-hole 41 and a second through-hole 43, by etching.

The distal end and base of the base columnar member 48 have the same width as of the lid columnar member 18. The distal end of the base columnar member 48 extends to just past the center of the base 40. The base columnar member 48 extends between the vibrating arms of the tuning-fork type crystal vibrating piece 30, as discussed later below.

Adjacent the edge wall 49 is a bonding film 45 that extends around the periphery of the base and faces the lid 10. The bonding film 45 comprises a gold (Au) layer having a thickness of 400 Å to 2000 Å.

Formed on the inner surface of the base 40 are a first connecting electrode 42 and a second connecting electrode 44. Formed on the outer surface (under-surface in the figure) of the base 40 are first and second external, metallized electrodes 55, 56. The first through-hole 41 extends from the inner surface to the outer surface of the base 40, connecting the first connecting electrode 42 to the first external electrode 55. Similarly, the second through-hole 43 connects the second connecting electrode 44 to the second external electrode 56. A metal film is formed in each of the first and second through-holes 41, 43, and the through-holes are sealed by a sealing material 70.

The lid concavity 17 and the base concavity 47 together define a cavity 22 of the package 80. In the cavity 22 a tuning-fork type crystal vibrating piece 30 is mounted on the mounts 52 using an electrically conductive adhesive 71.

The tuning-fork type crystal vibrating piece 30 comprises a pair of vibrating arms 21 and a base portion 23. A first base-portion electrode 31 and a second base-portion electrode 32 are formed on the base portion 23. Formed on the upper, lower, and side surfaces of one vibrating arm 21 is a first excitation electrode 33, and formed on said surfaces of the other vibrating arm 21 is a second excitation electrode 34. The first excitation electrode 33 is connected to the first base-portion electrode 31, and the second excitation electrode 34 is connected to the second base-portion electrode 32.

Each of the first base-portion electrode 31, second base-portion electrode 32, first excitation electrode 33, and second excitation electrode 34 is a metal double layer, desirably a gold (Au) layer of 400 Å to 2000 Å thickness layered on a chromium (Cr) layer of 150 Å to 700 Å thickness.

The first base-portion electrode 31 and second base-portion electrode 32 are connected to the first connecting electrode 42 and second connecting electrode 44, respectively using an electrically conductive adhesive 71. The first connecting electrode 42 is connected to the first external electrode 55, on the outer (lower) surface of the base 40 by the first through-hole 41. The second connecting electrode 44 is connected to the second external electrode 56, on the outer (lower) surface of the base 40, by the second through-hole 43. Thus, the first base-portion electrode 31 is electrically connected to the first external electrode 55, and the second base-portion electrode 32 is electrically connected to the second external electrode 56.

As shown in FIG. 1C, the piezoelectric device 100 of this embodiment is formed by aligning the lid 10 with the base 40 such that their respective inner surfaces face each other (see FIG. 1C). A bonding material 75 of eutectic metal, such as gold-silicone ($Au_{3.15}Si$) or gold-germanium ($Au_{12}Ge$), is applied between the first bonding film 45 and the second bonding film 15. As the bonding material 75 melts it spreads over substantially the entire surfaces of the bonding films 45. The molten bonding material 75 is cured to bond together the lid 10 and base 40.

Figure 2:
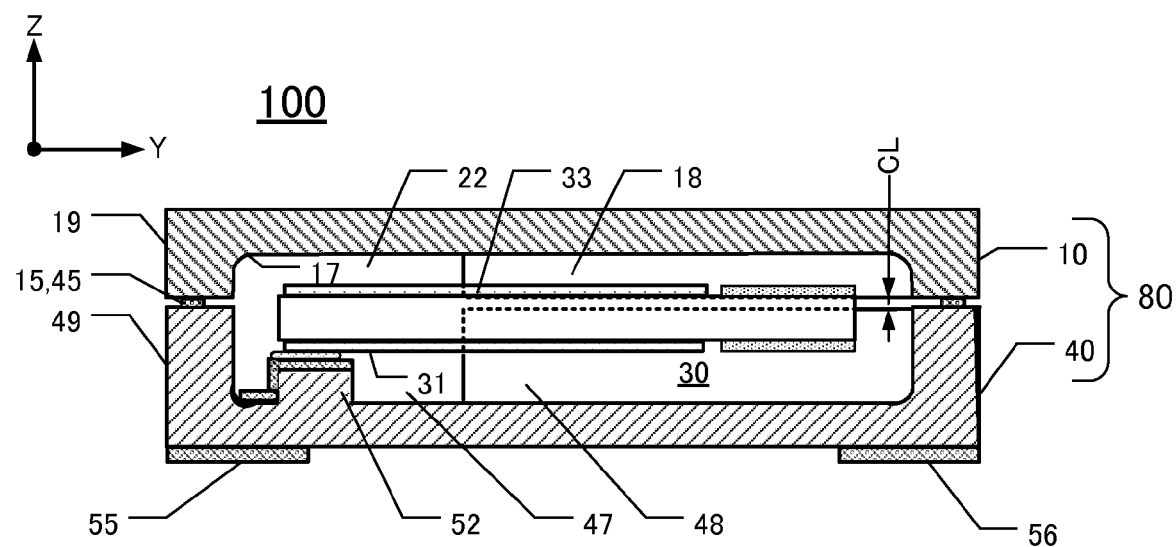
FIG. 2 is an elevational section along the line B-B in FIGS. 1A and 1B after the base and lid, shown in FIG. 1C, have been bonded together to form a piezoelectric vibrating device.

FIG. 2 is an elevational section of the piezoelectric device 100 along the line B-B line in FIG. 1A. The lid 10 and base 40 are bonded together in the figure. Whenever the lid 10 and base 40 are bonded together in this manner, the bonding films 45, 15 produce a clearance CL therebetween that is a sum of the thicknesses of the bonding films 45, 15. The clearance CL is also produced between the lower surface of the lid columnar member 18 and the upper surface of the base columnar member 48. The clearance CL ranges from about 800 Å to about 4000 Å (about 0.08 μm to about 0.4 μm).

Whenever the piezoelectric device 100 of this embodiment is subjected to an external impact force to both the lid 10 and the base 40, the lid 10 and base 40 may warp. If the lid 10 and base 40 warp about 0.1 μm to 0.4 μm, the columnar members 48 and 18 contact each other. Since the distal ends of the columnar members 48, 18 are situated in the center of the cavity 22, the lid 10 and base 40 do not fracture despite the warpage. Thus, even when the lid 10 and base 40 are made thinner as a result of miniaturizing the piezoelectric device 100, an acceptable level of package rigidity is nevertheless maintained.

Although not specifically shown, the first bonding film 45 and second bonding film 15 can be formed on the base columnar member 48 and lid columnar member 18, respectively, thereby bonding together the columnar members. Bonding the columnar members together in such a manner provides the package 80 with high rigidity despite the thinner profile of the lid 10 and base 40.

The columnar members 48, 18 within the package inhibit package warping by enhancing package rigidity. Also, the columnar members 48, 18 do not interfere with vibration of the tuning-fork type crystal vibrating piece 30. Note that in the depicted embodiment (FIGS. 1A and 1B) the distal portions (in the Y-axis direction) are wider (in the X-axis direction) than the proximal portions, thereby providing progressively increasing width with increasing distance (in the −Y-axis direction) from the proximal portions. Alternatively, the width can be constant (in the X-axis direction) for simplification of design and manufacturing.

Figure 3A:
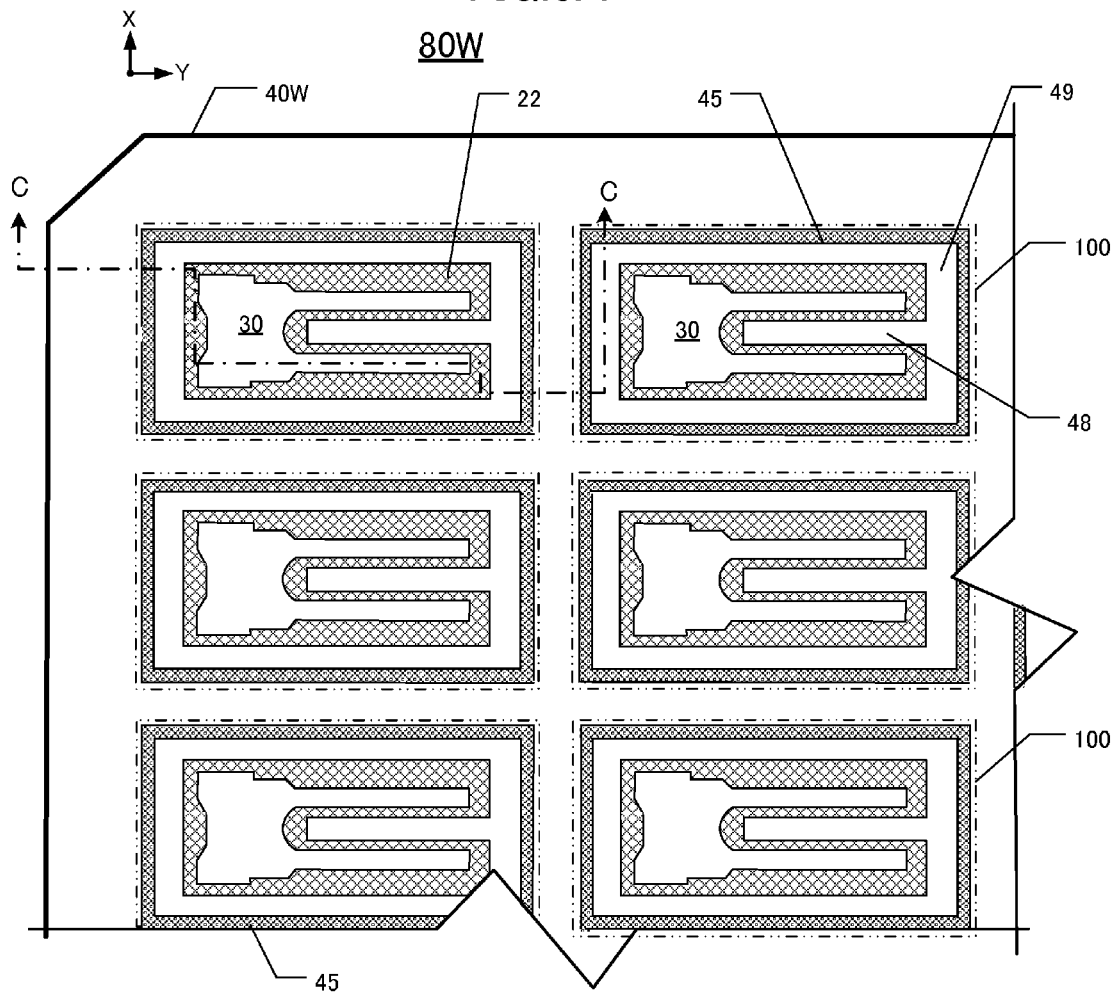
FIG. 3A is a plan view of a first embodiment of a package wafer as viewed from a lid wafer.
Figure 3B:
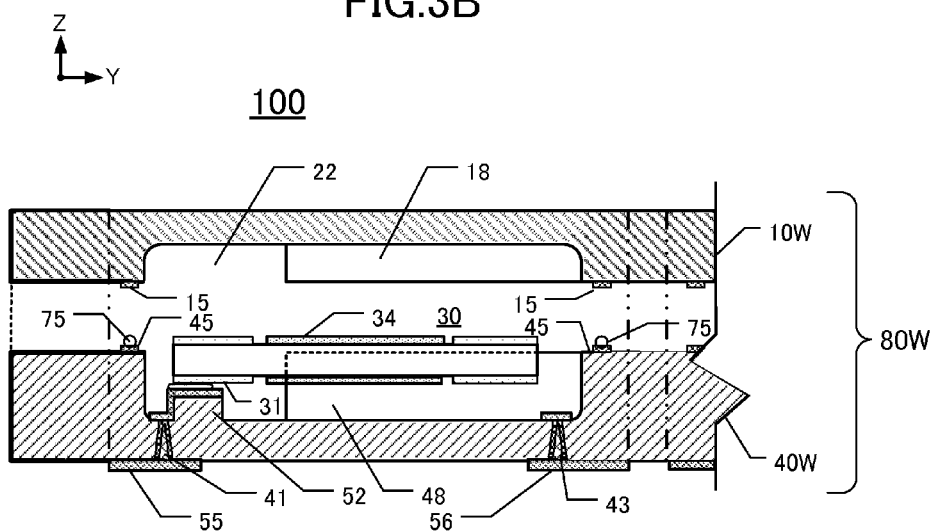
FIG. 3B is an enlarged elevational section along the line C-C in FIG. 3A.

FIG. 3A is a plan view of a package wafer 80W of this embodiment, as viewed from the lid 10. FIG. 3B is an enlarged elevational section along the line C-C in FIG. 3A. The package wafer 80W comprises a lid wafer 10W bonded to a base wafer 40W. For better comprehension, the lid wafer 10W and base wafer 40W shown in FIG. 3B are not yet bonded. Also, the first lid wafer 10W is depicted in FIG. 3A as if it were transparent, allowing the tuning-fork type crystal vibrating piece 30, mounted on the base 40, and the base columnar member 48 to be readily discernible. In FIG. 3A the package wafer 80 depicts regions corresponding to the outline profile of respective piezoelectric devices 100. These regions are denoted by a virtual line (two-dotted chain line). In addition, the cavity 22 is denoted using a mesh pattern for better comprehension.

In FIG. 1, a single piezoelectric device 100 is shown. During actual manufacture of these devices, multiple devices are manufactured simultaneously on wafer substrates made of glass or quartz crystal. I. e., as shown in FIG. 3A, the base wafer 40W on which multiple bases 40 are formed is prepared, and respective tuning-fork type crystal vibrating pieces 30 are placed thereon. Then the lid wafer 10W, on which multiple lids 10 have been formed, is aligned with and bonded to the base wafer 40W by a bonding material 75 to form a package wafer 80W. The package wafer 80W is diced into individual piezoelectric devices 100. As shown in FIG. 3A, multiple piezoelectric devices 100 are formed simultaneously on the X-Y plane of the base wafer 40W.

As shown in FIG. 3B, for forming the package wafer 80W, the bonding material 75 is applied to the first bonding film 45 on the base wafer 40W, and also applied to the second bonding film 15 on the lid wafer 10W. The lid wafer 10W is aligned with and applied to the base wafer 40W, and the resulting structure is placed in a vacuum-reflow furnace and heated for bonding.

Due to the presence of applied bonding material 75 for bonding together the base wafer 40W and lid wafer 10W, a space exists between the first bonding film 45 and second bonding film 25 before the bonding material 75 is melted. As a result of this space, the atmosphere inside the package wafer 80W can be exhausted during the time the device is being heated in the vacuum-reflow furnace. Similarly, as the package wafer 80W is being heated in a reflow furnace filled with an inert gas, the package wafer 80W can become filled with the inert gas.

In small-lot productions, ceramic can alternatively be used for fabricating the base 40, instead of glass or crystal.

Second Embodiment of Piexoelectric Device

Figure 4A:
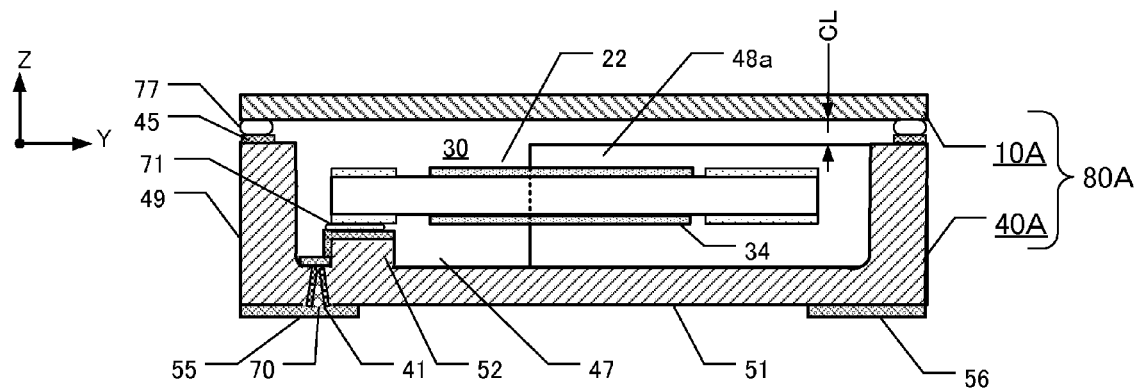
FIG. 4A is a elevational section of a second embodiment of a piezoelectric device including a tuning-fork type crystal vibrating piece mounted in the cavity of the package; the section is along the line C-C in FIG. 4B.
Figure 4B:
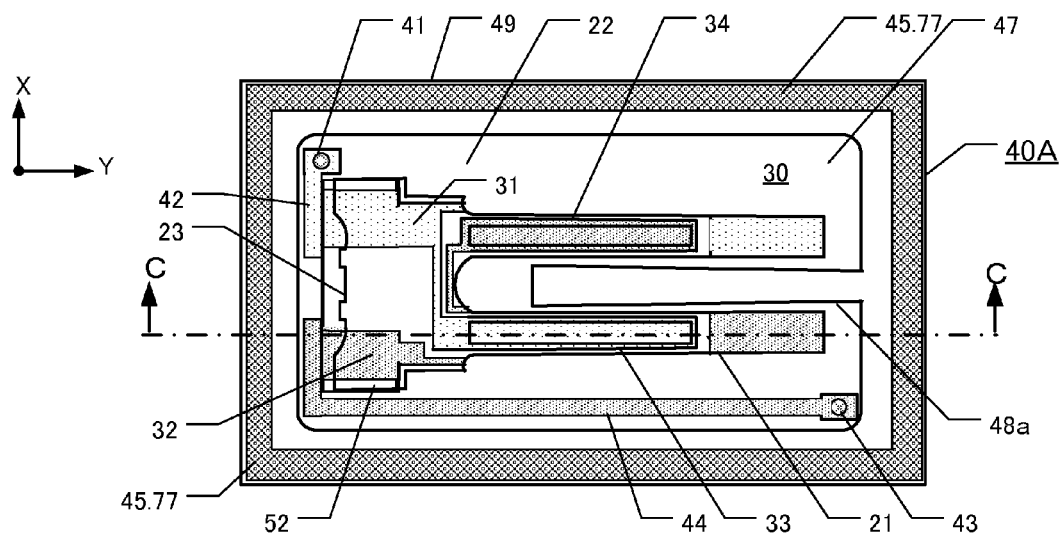
FIG. 4B is a plan view of the embodiment of FIG. 4A after removing the lid.

FIG. 4A is an elevational section of a second embodiment 110 of a piezoelectric device. FIG. 4B is a plan view of the device 110 after removing the lid 10A. The piezoelectric device 110 comprises a base 40A, having insulating properties, and a lid 10A. The lid 10A is made of KOVER® (an alloy of iron (Fe), nickel (Ni), and cobalt (Co)).

The base 40A comprises a bottom layer 51, a wall 49, a base columnar member 48a, and a pair of mounts 52. The base columnar member 48a extends into the center of the cavity 22, between the vibrating arms 21. The lid 10A does not include a columnar member. The wall 49 and base columnar member 48a are contiguous and have identical height. These features of the base 40A can be punch-pressed from ceramic "green sheets" each made from a slurry of ceramic powder (containing alumina and binder). The green sheets are stacked superposedly atop one another and fired to produce a laminated ceramic structure. Thus, the package 80A is made of multiple ceramic "green layers" that collectively define the cavity 22, in which is placed the tuning-fork type crystal vibrating piece 30. Mounting of the tuning-fork type crystal vibrating piece 30 on the mounts 52 has already been described in connection with the first embodiment. Consequently, in the following discussion of the second embodiment, only steps that are different are described below.

The first bonding film 45 is formed on the top edge of the wall 49. Brazing filler metal 77 is applied to the first bonding film 45 for bonding the lid 10A. Thus, the wall 49 and lid 10A are bonded together by the brazing filler metal 77.

Upon completing bonding of the lid 10A to the base 40A, a clearance or gap CL (having a height equal to the thickness of the first bonding film 45 plus the thickness of the brazing filler metal 77) is established between the lid 10A and the columnar member 48a. Even if a large external force is applied to the surface of the lid 10A (upper surface in FIG. 4A) and/or the bottom surface of the base 40A (lower surface in FIG. 4A), the package 80A exhibits less warpage due to the package-rigidifying effect of the columnar member 48a.

Third Embodiment of Piezoelectric Device

Figure 5A:
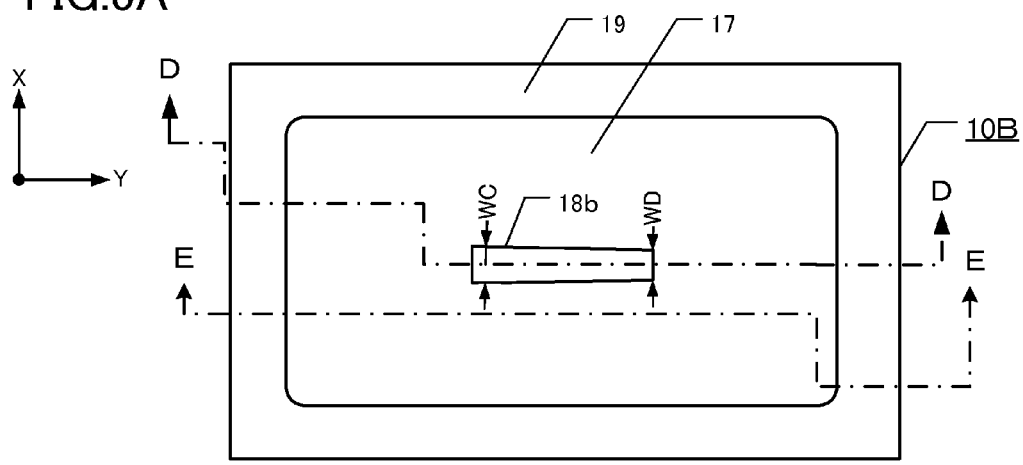
FIG. 5A is a plan view of the inner surface of the package lid of a third embodiment of a piezoelectric device.
Figure 5B:
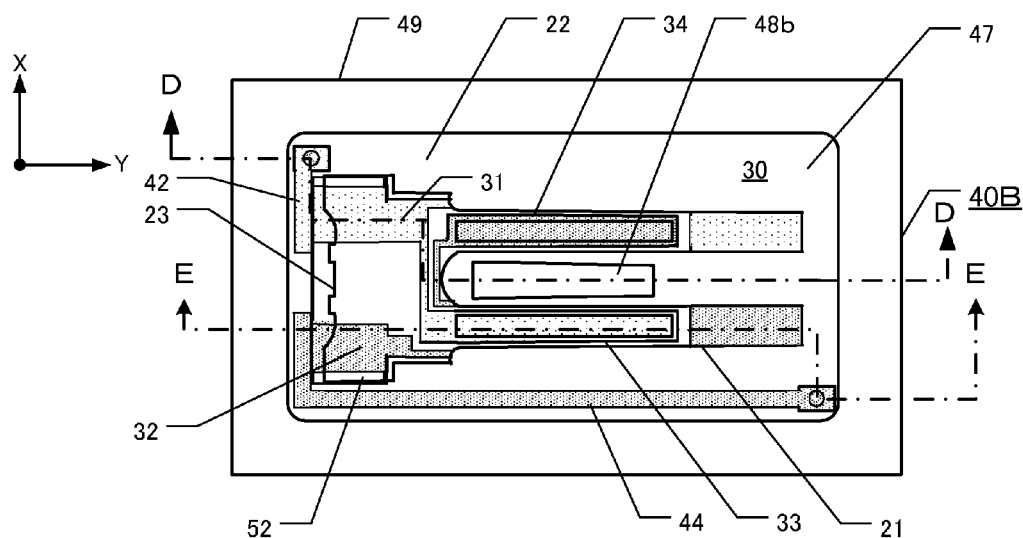
FIG. 5B is a plan view of the base of the third embodiment, shown with the tuning-fork type crystal vibrating piece mounted to it.
Figure 5C:
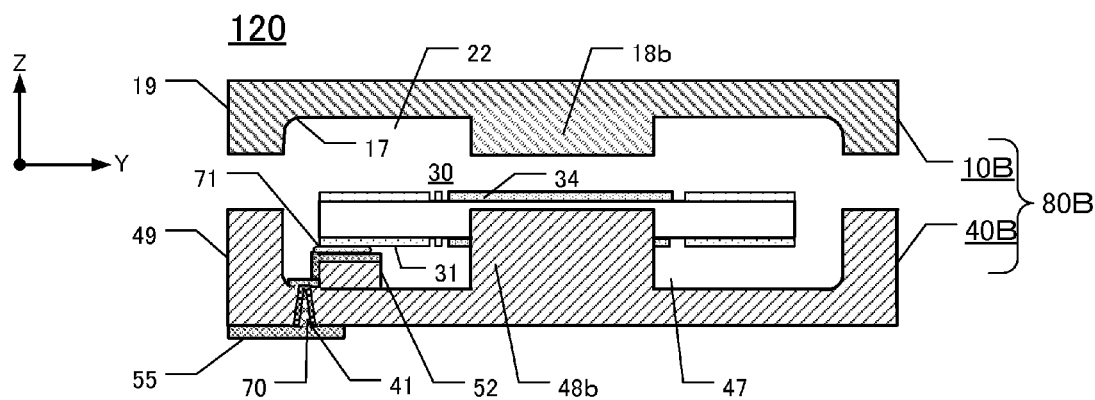
FIG. 5C is an elevational section view along the line D-D in FIG. 5A and FIG. 5B, showing that the base and lid co-aligned (but vertically separated from each other) for subsequent bonding.

FIG. 5A is a plan view of the lid 10B of this embodiment 120, FIG. 5B is a plan view of the base 40B on which a tuning-fork type crystal vibrating piece 30 is mounted, and FIG. 5C is an elevational section along the line D-D in FIGS. 5A and 5B, but with the lid and base not yet bonded together.

This embodiment 120 includes a base columnar member 48b and a lid columnar member 18b. These columnar members are different from corresponding columnar members of the first embodiment 100. The third embodiment 120 comprises a lid 10B and a base 40B that are made of crystal. Differences from the first embodiment are described below.

One of the indicators of hardness of industrial materials is the "Knoop hardness." A higher Knoop hardness number indicates increased hardness, and a lower Knoop hardness number indicates relative softness. The Knoop hardness number of borosilicate glass (commonly used for lids and bases) is 590 kg/mm$^2$, and the Knoop hardness number of quartz crystal is 710 to 790 kg/mm$^2$. Thus, using crystal instead of glass for fabricating the lid 10B and base 40B of this embodiment 120 provides a package with greater hardness than one made of glass. If the package were made of glass, the glass would have to be correspondingly thicker to provide a package with the same specified hardness that otherwise could be provided with a thinner package made of crystal. Thus, whenever crystal is substituted for glass for fabricating the lid and the base of a piezoelectric device having a designated hardness, the device can be further miniaturized and provided with a thinner profile without compromising hardness.

As shown in FIG. 5A, the inner surface of the lid 10B defines a lid concavity 17 that faces the base 40B. From about the middle of the concavity 17 extends the lid columnar member 18b, which has an elongated shape extending in the Y-axis direction. The wall 19 and lid columnar member 18b have the same height (Z-axis direction). The lid concavity 17 of the lid 10B is formed by wet etching. One end (in the Y-axis direction) of the lid columnar member 18b has a width WD that is narrower than the width WC on the other end. The lid columnar member 18b extends between the vibrating arms 21, which nevertheless do not collide with the lid columnar member 18b when they are vibrating. Collision prevention is facilitated by the narrower width WD at the one end.

The second bonding film 15 applied to the lid 10 of the first embodiment is not applied to the lid 10B of the third embodiment.

Turning now to FIG. 5B, the base 40B includes a base columnar member 48b extending (in the Y-axis direction) between the vibrating arms 21 of the tuning-fork type crystal vibrating piece 30. The ends (in the Y-axis direction) of the base columnar member 48b have similar respective widths (in the X-axis direction) as the lid columnar member 18b. The height (in the Z-axis direction) of the lid columnar member 48b is equal to the height of the wall 49.

The first bonding film 45 (shown in FIG. 2) applied to the base 40 of the first embodiment is not applied to the base 40B of the third embodiment.

Figure 6:
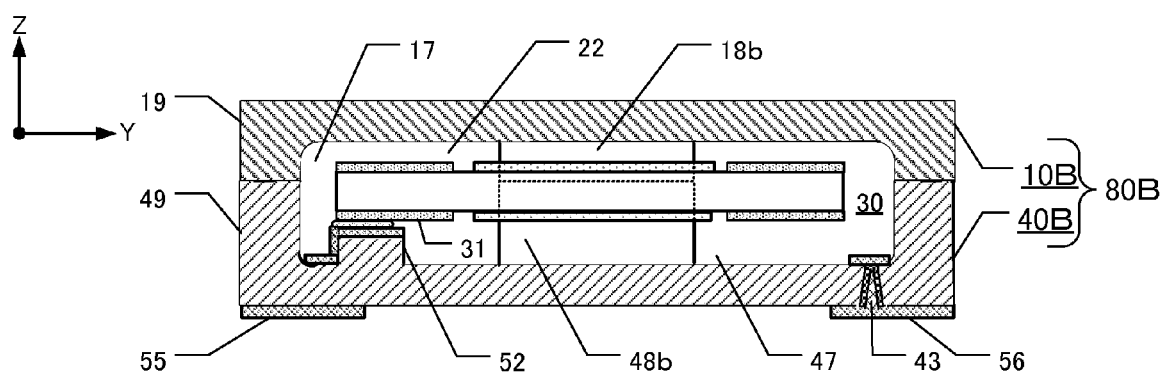
FIG. 6 is an elevational section along the line E-E in FIG. 5 after the base and lid, shown in FIG. 5C, have been bonded together to form a piezoelectric vibrating device.

As shown in FIG. 5C, the piezoelectric device 120 of this embodiment is formed by layering the lid 10B on the base 40B, both of which being made of crystal. The bonding surfaces of the lid 10B and of the base 40B (including the upper surface of the base columnar member 48b and the lower surface of the lid columnar member 18b) are mirrored and exposed to a plasma- or ion-beam treatment to activate them. The activated surfaces are then placed in mutual contact and bonded together by siloxane (Si—O—Si) bonding. Thus, as the lid 10B is bonded to the base 40B, the columnar members 48b, 18b are bonded together to form a single column in the cavity 47. This is shown in FIG. 6, which is an elevational section along the line E-E line in FIGS. 5A and 5B.

Even if large external force is applied to the surface of the lid 10B (upper surface in FIG. 6) or to the bottom surface of the base 40B (lower surface in FIG. 6), they experience less warpage due to the columnar members 48b, 18b being present together and bonded together. The distal (bonded) ends of the columnar members 48b, 18b are situated substantially in the middle of the cavity 22, which is effective in preventing warpage or fracture of the lid 10B and base 40B. Thus, despite the allowable thinner profile of the lid 10B and/or base 40B achievable by miniaturization of this embodiment 120, a specified level of package rigidity can be maintained.

In FIGS. 5A and 5B, the widths (in the X-axis direction) of the distal ends of the columnar members 48b and 18b increase from right to left. Alternatively, these widths can be equal and constant.

Fourth Embodiment of Piezoelectric Device

Figure 7A:
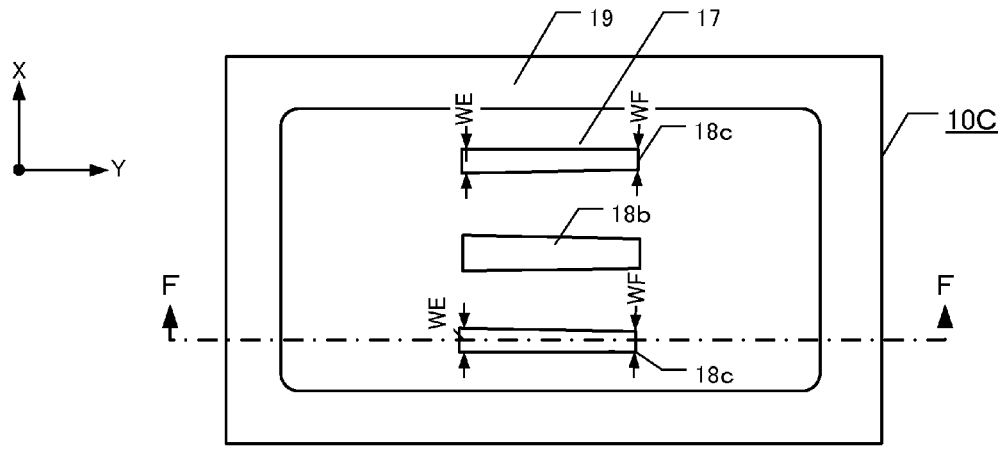
FIG. 7A is a plan view of the inner surface of a package lid of a fourth embodiment of a piezoelectric device.
Figure 7B:
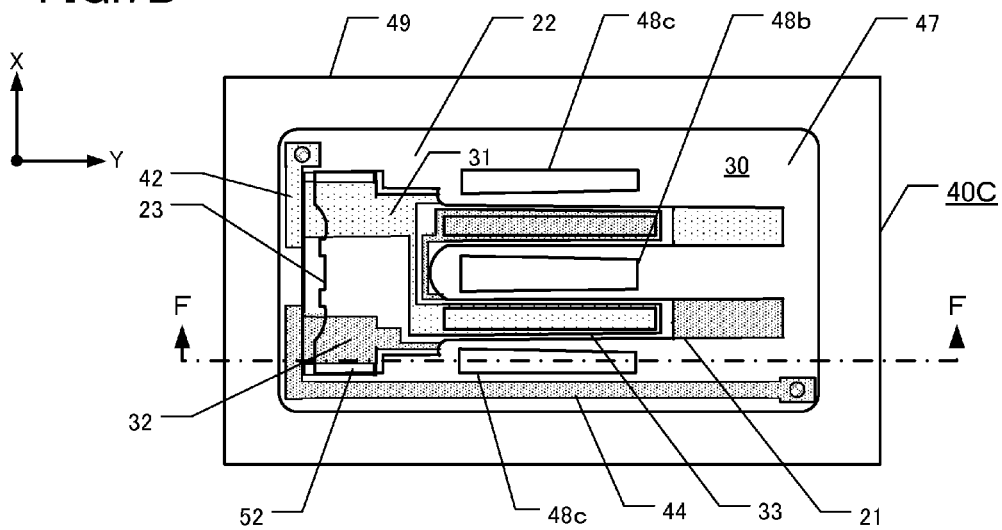
FIG. 7B is a plan view of the base of the fourth embodiment on which the first tuning-fork type crystal vibrating piece 30 is mounted.
Figure 7C:
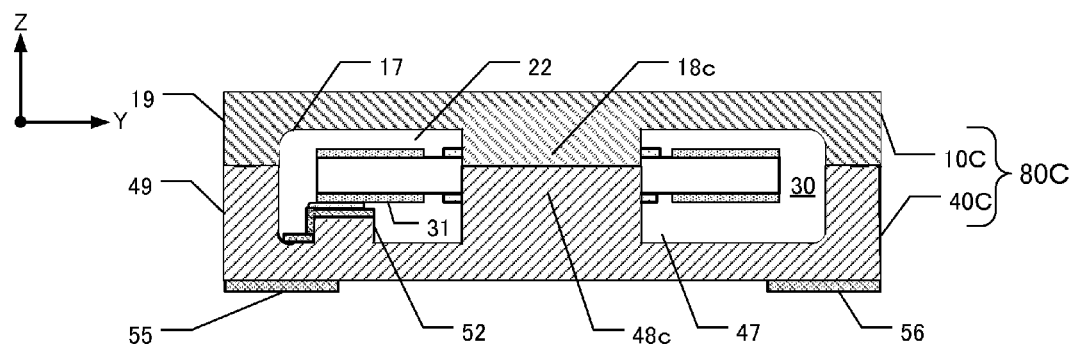
FIG. 7C is an elevational section along the line F-F line in FIGS. 7B and 7A, showing the manner in which the parts thereof are layered and bonded.

FIG. 7A is a plan view of the inner surface of a lid 10C for the package of this embodiment 130 of a piezoelectric device. FIG. 7B is a plan view of the base 40C, on which the tuning-fork type crystal vibrating piece 30 is mounted. FIG. 7C is an elevational section along the line F-F of this embodiment 130, after bonding. The piezoelectric device 130 comprises, in addition to the centrally located columnar members 18b, 48b found in the third embodiment 120, first assistive columnar members 48c and second assistive columnar members 18c. The fourth embodiment 130 also comprises a lid 10C and a base 40C, both of which are made of quartz crystal. Components and features of this fourth embodiment that are different from corresponding features in the third embodiment 120 are described below.

Referring to FIG. 7A, a pair of second assistive columnar members 18c extend in the Z-axis direction from the concavity 17 of the lid 10C. The second assistive columnar members 18c are located outboard of the vibrating arms 21, between the base portion 23 and the distal ends of the vibrating arms 21. The width WF of each second assistive columnar member 18c on its +Y-end is narrower than the width WE of each second columnar member on its −Y-end. The width WF is narrower to prevent the distal ends of the vibrating arms 21 from colliding with the second assistive columnar members 18c. In other words, the range of oscillation of the vibrating arms 21 is greater at their distal ends than at the basal end 23. Thus, the sides of the second assistive columnar members 18c facing the vibrating arms are dimensioned to correspond with the range of oscillation.

As shown in FIG. 7B, the pair of first assistive columnar members 48c is formed on the base 40C outboard of the vibrating arms 21 and between the basal end 23 and the distal ends of the vibrating arms 21. The respective widths of the first assistive columnar members 48c at their −Y-ends and +Y-ends are equal to respective widths of the second assistive columnar members 18c. The Z-direction height of the first assistive columnar member 48c is equal to the height of the wall 49.

As shown in FIG. 7C, when the lid 10C is bonded to the base 40C, the first columnar member 48b and second columnar member 18b are bonded together. Also bonded together are the first assistive columnar members 48c to their respective second assistive columnar members 18c. Even if a large external force is applied to the external surface of the lid 10C (upper surface in FIG. 7C) or to the external surface of the base 40C (lower surface in FIG. 7C), the packages 80C exhibit less warpage due to the presence of the first and second columnar members 48b, 18b and the first and second assistive columnar members 48c, 18c. Thus, despite the thinner profile of the lid 10C or the base 40C resulting from miniaturization of the piezoelectric device 130, a desired package rigidity can be maintained.

Note that a piezoelectric device provided with only the first and second assisting columnar members 48c, 18c (but not the columnar members 48b, 18b), still exhibits enhanced rigidity.

Fifth Embodiment of Piezoelectric Device

Figure 8A:
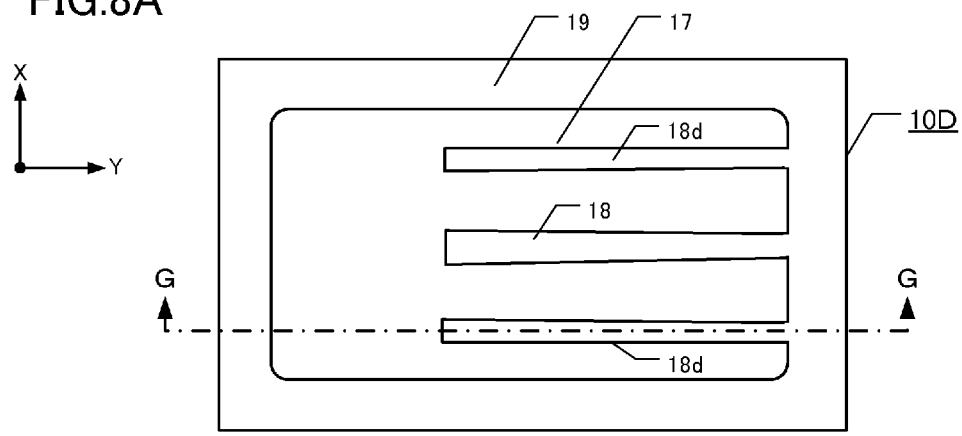
FIG. 8A is a plan view of the package of a fifth embodiment of a piezoelectric device
Figure 8B:
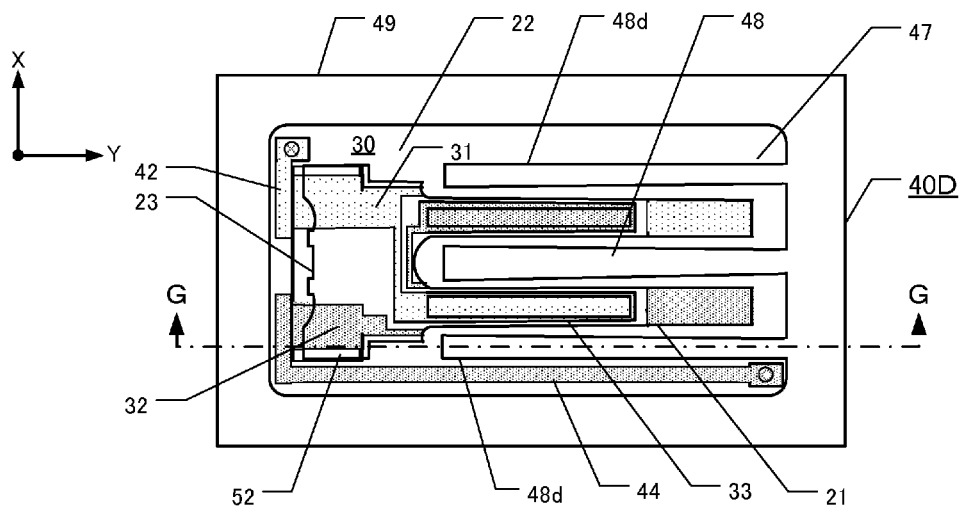
FIG. 8B is a plan view of a base on which a tuning-fork type crystal vibrating piece has been mounted.
Figure 8C:
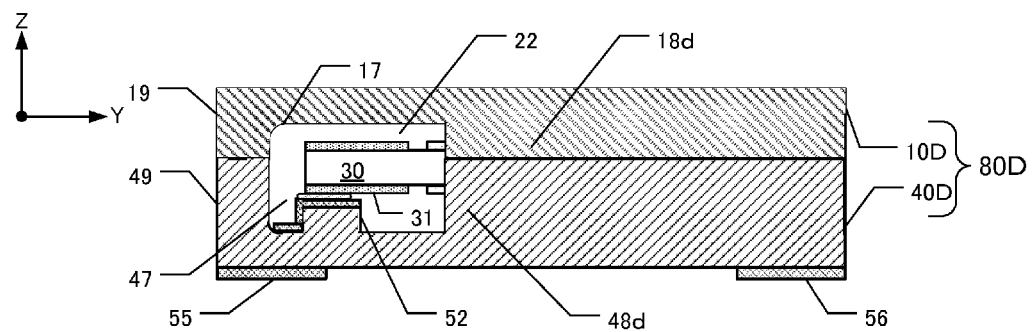
FIG. 8C is an elevational section along the line G-G in FIGS. 8A and 8B, showing the layered and bonded parts of the fifth embodiment of a piezoelectric device.

This embodiment of a piezoelectric device 140 is shown in FIGS. 8A-8C. FIG. 8A is a plan view of the inner surface of a lid 10D of the device 140; FIG. 8B is a plan view of a base 40D on which a tuning-fork type crystal vibrating piece 30 is mounted; and FIG. 8C is an elevational section along the line G-G in FIGS. 8A and 8B.

This embodiment 140 includes first and second assistive columnar members 48d, 18d in addition to the columnar members 48, 18 in the first embodiment 100. This fifth embodiment 140 also includes a lid 10D and a base 40D, which are both made of quartz crystal. Features of this embodiment that are different from corresponding features in the first embodiment 100 are described below.

Turning to FIG. 8A, the lid 10D defines a concavity 17 from which a pair of second assistive columnar members 18d extend in the +Z-direction, outboard of the vibrating arms 21 and between the base portion 23 and the distal ends of the vibrating arms 21. The +Y-ends of the second assistive columnar members 18d (right ends in FIG. 8A) are narrower (in the X-axis direction) than the −Y-ends (left ends in FIG. 8A).

These width differences prevent the vibrating arms from colliding with the second assistive columnar members 18d.

In FIG. 8B, the first assistive columnar members 48d extend from the inner surface of the base 40D outboard of the vibrating arms 21 and between the base portion 23 and the distal ends of the vibrating arms 21. The respective widths (X-axis direction) of the −Y-ends of the first assistive columnar members 48d are less than the respective widths (X-axis direction) of the +Y-ends of the first assistive columnar members 48d. In any event, these widths are equal to corresponding respective widths of the second assistive columnar members 18d. The height (Z-axis direction) of the first assistive columnar members 48d is equal to the height of the wall 49.

As shown in FIG. 8C, whenever the lid 10D and base 40D are bonded together, a respective column is formed by the bonding together of the base columnar member 48 to the lid columnar member 18. Respective columns are also formed by the bonding together of each second assistive columnar member 18d with its respective second assistive columnar member 48d. Even if a large external force is applied to the surface of the lid 10D (upper surface in FIG. 8C) or to the bottom surface of the 40D (lower surface in FIG. 8C), the package 80D exhibits less warpage due to the presence in the package of the bonded columns.

Note that a piezoelectric device provided with only the first and second assistive columnar members 48d, 18d still has high rigidity even if the lid columnar member and base columnar member 48 are missing.

Sixth Embodiment of Piezoelectric Device

FIGS. 9A-9D are respective schematic views of a piezoelectric device 150 according to this sixth embodiment. This embodiment 150 includes not only a lid 10E and base 40E, but also a crystal frame 50. The crystal frame 50 is sandwiched between the lid 10E and the base 40E, and these three components are bonded together to form the piezoelectric device 150.

FIG. 9A is a plan view of the inner surface of the lid 10E made of a single-crystal material. FIG. 9B is a plan view of the crystal frame 50 that includes a tuning-fork type crystal vibrating piece 20 and outer frame portion 29. FIG. 9C is a plan view of the base 40E made of a single-crystal material. FIG. 9D is an elevational section view along the line H-H of FIGS. 9A-9C before bonding.

In this embodiment a crystal material is used for fabricating the lid 10E and the base 40E, as well as the crystal frame 50. Whenever the piezoelectric device 150 is being manufactured or being attached to a printed circuit board, heat is applied to the piezoelectric device. If the lid 10E and base 40E are made of a material other than crystal, the interior of the piezoelectric device becomes stressed due to differences in the coefficient of thermal expansion of crystal material versus the thermal expansion coefficient of another material. As these differences in thermal expansion coefficient increase, the stress also increases, which can result in fracture of the corners of the outer frame portion 29 of the crystal frame 50. Thus, it is advantageous to reduce as much as possible the differences in thermal expansion coefficient between the lid 10E, base 40E, and the crystal frame 50. For example, it is advantageous to fabricate the lid 10E and base 40E of crystal material because, compared to making them of glass, the difference in thermal expansion coefficient of the crystal frame 50 can be narrowed, which reduces stress accumulation in the interior of the piezoelectric device 150. Moreover, making these components of a crystal material permits miniaturization or provision of a thinner profile of the crystal.

As shown in FIG. 9A, the lid 10E has a lid concavity 17 and a lid columnar member 18e that face the crystal frame 50.

FIG. 9B is a plan view of a crystal frame 50 to which a tuning-fork type crystal vibrating piece 20 is coupled. The main difference from the tuning-fork type crystal vibrating piece 30 shown in the first embodiment is that, in this sixth embodiment, the tuning-fork type crystal vibrating piece 20 is surrounded by the crystal frame portion 29, and the crystal frame portion 29 is a part of the wall of the package 80E.

The crystal frame 50 comprises the tuning-fork type crystal vibrating piece 20 including the base portion 23, the pair of vibrating arms 21, and a pair of supporting arms 25. A cavity 22 is formed between the tuning-fork type crystal vibrating piece 20 and the crystal frame portion 29. The first crystal frame 50 has a first base electrode 31 and a second base electrode 32 extending from the base portion 23 to the crystal frame portion 29 via the supporting arms 25. The tuning-fork type crystal vibrating piece 20 is a very small vibrating piece oscillating at 32.768 kHz, for example.

The crystal frame 50 includes a columnar member 28. The second tuning-fork type crystal vibrating piece 20 is supported by the supporting arms 25 extending outwardly from the base portion 23. The supporting arms 25 and the columnar member 28 are connected to the crystal frame portion 29. The columnar member 28 and the crystal frame 20 have equal thickness in the X-axis direction.

The supporting arms 25 extend from one end of the base portion 23 in the same direction (Y-axis direction) in which the vibrating arms 21 extend and connect to the crystal frame portion 29. The supporting arms 25 reduce oscillation leakage from the vibrating arms 21 to outside the piezoelectric device 150. The supporting arms 25 also reduce the vulnerability of the device to external temperature changes and physical impacts.

As shown in FIG. 9C, the inner surface of the base 40E defines a base concavity 47 and a columnar member 48e that face the crystal frame 50. The base concavity 47 and columnar member 48e can be formed by wet-etching the surface of the base 40E, in which event a first through-hole 41 and a second through-hole 43 are formed concurrently. A first connecting electrode 42 and a second connecting electrode 44 are formed on the surface of the base 40E.

As shown in FIGS. 9C and 9D, the first connecting electrode 42 is connected to a first external electrode 55, formed on the bottom surface of the base 40E, via a first through-hole 41. A second connecting electrode 44 is connected to a second external electrode 56, formed on the bottom surface of the base 40E, via a second through-hole 43. Thus, whenever the lid 10E, the crystal frame 50, and the base 40E are registered with each other as a sandwich and bonded together, first and second base-portion electrodes 31 and 32 (formed on the lower surface of the crystal frame portion 29) are connected to the first and second connecting electrodes 42 and 44, respectively, formed on the surface of the base 40E. That is, the first base-portion electrode 31 is electrically connected to the first external electrode 55, and the second base-portion electrode 32 is electrically connected to the second external electrode 56.

As shown in FIG. 9D, the lid 10E, crystal frame 50, and base 40E are bonded together by siloxane bonding. To perform this bonding, respective bonding surfaces are mirrored and the mirrored surfaces are treated with plasma or an ion beam to activate them. Then, these three components are brought into registration with each other just before bonding.

More specifically, respective bonding surfaces of the base columnar member 48e, the lid columnar member 18e, and the third columnar member 28 are mirrored, followed by treatment of the mirrored surfaces with plasma or an ion beam. When the lid 10E, crystal frame 50, and base 40E are bonded together, the base columnar member 48e, lid columnar member 18e, and the third columnar member 28 are also bonded together. As a result, columns in the cavity are produced from the base columnar member 48e, lid columnar member 18e, and the third columnar member 28. The package 80E is not easily warped even if a large external force is applied to the outer surface of the lid 10E (upper surface in FIG. 9D) or to the outer surface of the base 40E (lower surface in FIG. 9D) because the rigidity of the package 80E is enhanced by the presence of the columns provided by the base columnar member 48e, lid columnar member 18e, and third columnar member 28. The distal ends of the base columnar member 48e, lid columnar member 18e, and third columnar member 28 are situated in the center of the cavity 22 so that the lid 10E or base 40E does not warp sufficiently to be fractured. As a result, despite a thinner profile of the lid 10E and/or base 40E produced by miniaturization of the piezoelectric device 150, a specified rigidity is maintained.

After completion of siloxane bonding of the base 40E, crystal frame 50, and lid 10E to form the piezoelectric device 150, the first and second through-holes 41 and 43 are sealed. For example, a sealing material 70 of gold-germanium alloy is placed on the first and second thorough-holes 42, 43, and the sealing material 70 is melted in a reflow furnace under a vacuum or in an inert-gas environment for sealing. As a result, the interior of the package 80E of the piezoelectric device 150 is in a vacuum state or filled with inert gas.

Seventh Embodiment of Piezoelectric Device

Figure 10A:
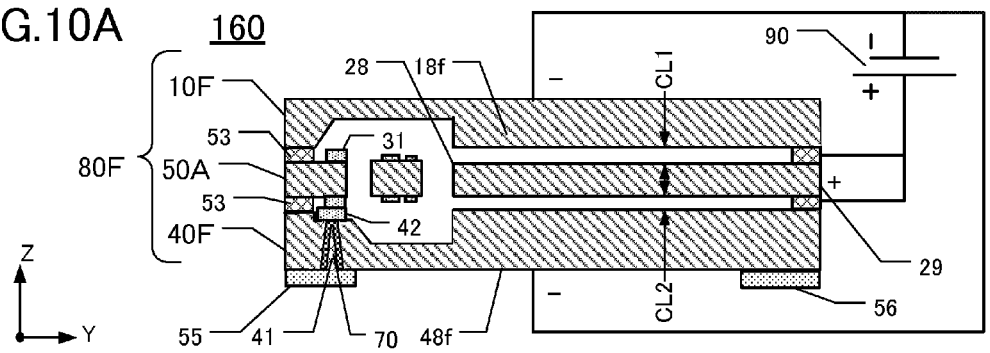
FIG. 10A is an elevational section of the base, frame, and lid of a seventh embodiment of a piezoelectric device 160, as set up for anodic bonding.
Figure 10B:
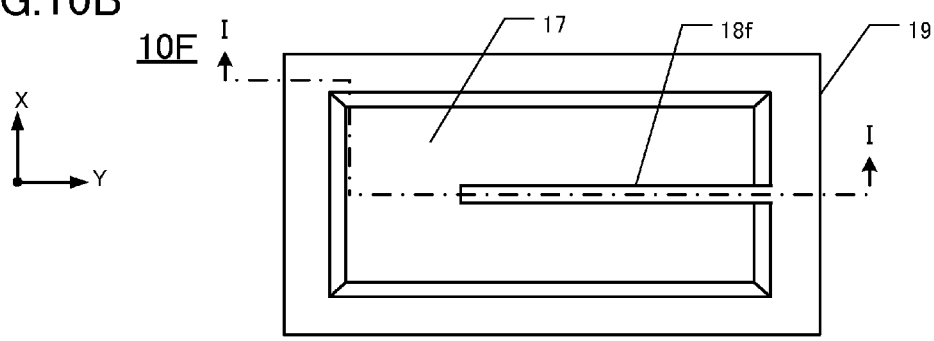
FIG. 10B is a plan view of the inner surface of a package lid used in the seventh embodiment of a piezoelectric vibrating device.
Figure 10C:
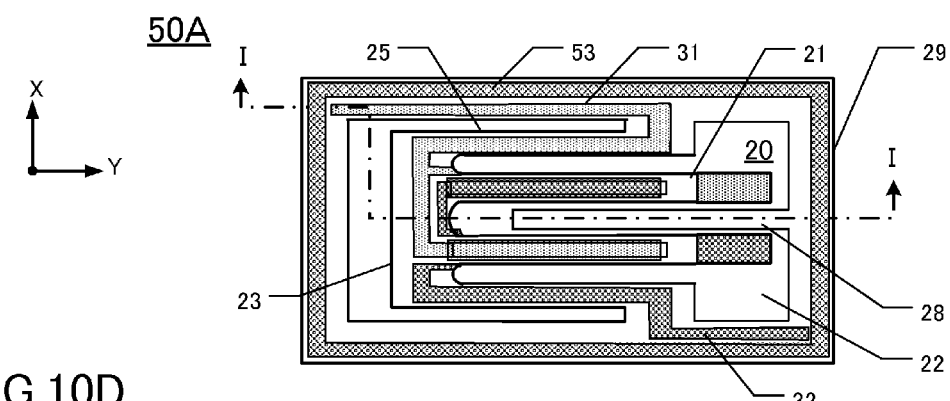
FIG. 10C is a plan view of a crystal frame as used in some embodiments of a piezoelectric vibrating device.
Figure 10D:
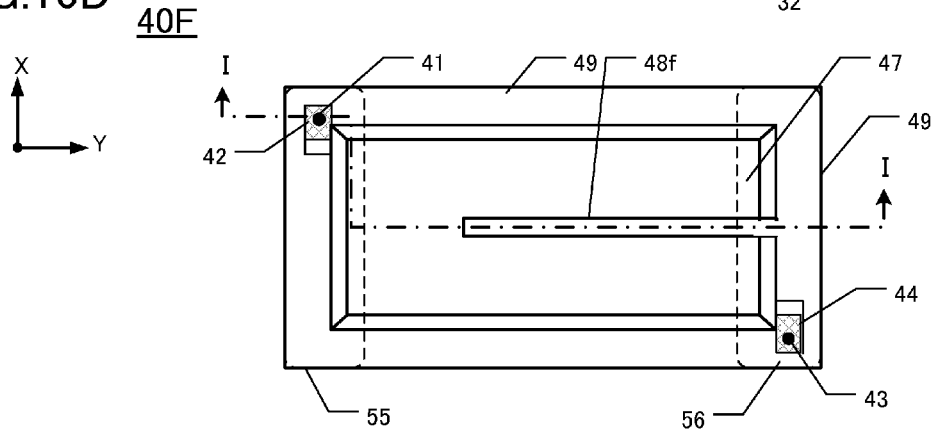
FIG. 10D is a plan view of the inner surface of a package base used in the seventh embodiment.

FIGS. 10A-10D are schematic views of this seventh embodiment of a piezoelectric device 160, in which the crystal frame portion 29 of a crystal frame 50A is sandwiched between a lid 1 OF and a base 40F. These components are bonded together to form the piezoelectric device 160. FIG. 10A is a schematic elevational section of this embodiment 160 configured for anodic bonding. FIG. 10B is a plan view of the inner surface of the 10F; FIG. 10C is a plan view of a crystal frame 50A; and FIG. 10D is a plan view of the inner surface of a base 40F.

FIG. 10A is an elevational section along the line I-I in FIGS. 10B-10D, in which the lid 10F, base 40F, and crystal frame 50A are bonded together by anodic bonding. The base 40F is bonded to the lower surface of the crystal frame 50A, and the lid 10F is bonded to the upper surface of the crystal frame 50A. The wiring diagram is of a circuit for performing anodic bonding.

The lid 10F and base 40F shown in FIGS. 10B and 10D are made of Pyrex glass or borosilicate glass containing metal ions, such as sodium ions. The lid 10F defines a lid concavity 17 and a lid columnar member 18f that extends toward the crystal frame 50A. The base 40F also defines a base concavity 47 and a base columnar member 48f that extends toward the crystal frame 50A. On the crystal frame 50A the tuning-fork type crystal vibrating piece 20 is formed by etching.

As shown in FIG. 10C, a metal film 53 is formed on both the upper and lower surfaces of the outer frame portion 29 of the crystal frame 50A. The metal film 53 is formed by sputtering or vacuum deposition. The metal film 53 is made of aluminum (Al) having a layer thickness of 1000 Å to 1500 Å. Other components of the crystal frame 50 are similar to corresponding components of the crystal frame 50, so further description of such components is not provided below.

In FIG. 10D, the base 40F defines a base concavity 47 and a base columnar member 48f that face the crystal frame 50A. When the base concavity 47 and base columnar member 48f are formed by etching, first and second through-holes 41 and 43 are also formed concurrently. First and second connecting electrodes 42 and 44 are formed on the upper surface of the base 40F. A first external electrode 55 and a second external electrode 56 are formed on the lower surface of the base 40F.

During assembly, the lid 10F and base 40F sandwich the crystal frame 50A having the tuning-fork type crystal vibrating piece 20. For bonding the upper surface of the lid 10F is connected to a negative electrical potential, while the upper surface of the crystal frame 29 and the metal film 53 of the lower surface are connected to a positive potential. A dc potential of 400V is connected for 10 minutes from a DC power-source 90 to achieve anodic bonding. After completing anodic bonding, the package 80F is completed.

In FIG. 10A, after the piezoelectric device 160 is anodic-bonded, a clearance or gap CL1, having the same thickness as of the metal film 53, is formed between the third columnar member 28 and the lower surface of the lid columnar member 18f. Also formed is a clearance CL2, having the same thickness as of the metal film 53 between the third columnar member 28 and the upper surface of the base columnar member 48f. The width of each clearance CL1, CL2 (and of the metal film 53) is 1000 Å to 1500 Å.

The piezoelectric device 160 of this embodiment is not easily warped even if a large external force is applied to the surface of the lid 10F (upper surface in FIG. 10A) or to the bottom surface of the base 40F (lower surface in FIG. 10A) because the rigidity of the package 80F is enhanced by the presence of the columns made of the base columnar member 48f, the lid columnar member 18f, and the third columnar member 28.

Representative embodiments are described above. It will be understood by those skilled in the art that these embodiments can be modified or changed while not departing from the spirit and scope of them and/or of the appended claims. For example, for a crystal unit, various piezoelectric single-crystal materials, such as lithium niobate, can be used as substitute for quartz crystal. Further, principles of this invention can be applied to a piezoelectric resonator in which an integrated circuit incorporating an oscillation circuit is placed on a base beside a piezoelectric crystal unit.

In the foregoing embodiments, the cross-section of the columnar bodies has an elongated shape that extends substantially parallel to the vibrating arms. Alternatively, the cross-sections can be a rectilinear, elliptical, or round.

What is claimed is:

1. A surface-mounted piezoelectric device, comprising:
   a tuning-fork type piezoelectric vibrating piece having a base portion and a pair of vibrating arms extending in a first direction from the base portion, the vibrating arms having respective distal ends; and
   a package comprising a wall forming a cavity for accommodating the tuning-fork type piezoelectric vibrating piece, and at least one package-stiffening columnar body situated between the vibrating arms in the cavity.

2. The device of claim 1, wherein the columnar body is elongated and extends in the first direction along at least a portion of the vibrating arms.

3. The device of claim 2, wherein:
   the vibrating arms extend from a base portion; and
   the columnar body has a width in a second direction, normal to the first direction, that is narrower nearer the distal ends of the vibrating arms and is wider nearer the base portion.

4. The device of claim 2, wherein:
   the package comprises a base supporting the tuning-fork type piezoelectric vibrating piece and a lid bonded to the base;
   the columnar body comprises a columnar member projecting from the base; and
   the lid is made of metal.

5. The device of claim 1, wherein the columnar body extends from the wall of the package.

6. The device of claim 1, wherein the package is made of quartz crystal.

7. The device of claim 1, wherein:
   the package comprises a base supporting the tuning-fork type piezoelectric vibrating piece and a lid bonded to the base; and
   the columnar body includes a base columnar member projecting from the base and a lid columnar member projecting from the lid.

8. The device of claim 7, wherein a gap exists between the base columnar member and the lid columnar member.

9. The device of claim 1, wherein:
   the package comprises a base supporting the tuning-fork type piezoelectric vibrating piece and a lid bonded to the base;
   the columnar body comprises a columnar member projecting from the base; and
   the lid is made of metal.

10. The device of claim 1, wherein:
    the package comprises a frame surrounding the tuning-fork type piezoelectric vibrating piece, a base bonded to one surface of the frame, and a lid bonded to the other surface of the frame; and
    the columnar body comprises a first columnar member projecting from the base, a second columnar member projecting from the lid toward the first columnar member, and a third columnar member extending from the frame toward the first and second columnar members.

11. The device of claim 10, wherein respective clearances exist between the first columnar member and the third columnar member, and between the second columnar member and the third columnar member.

12. A surface-mounted piezoelectric device, comprising:
    a tuning-fork type piezoelectric vibrating piece having a base portion and a pair of vibrating arms extending in a first direction from the base portion, the vibrating arms having respective distal ends; and
    a package comprising a wall forming a cavity for accommodating the tuning-fork type piezoelectric vibrating piece, and at least one package-stiffening columnar body situated in the cavity outboard of the vibrating arms between the base portion and the distal ends of the vibrating arms, wherein the columnar body is elongated and extends in the first direction along at least a portion of the vibrating arms, and the columnar body has a width in a second direction, normal to the first direction, that is narrower nearer the distal ends of the vibrating arms and is wider nearer the base portion.

13. The device of claim 12, wherein the columnar body extends from the wall of the package.

14. The device of claim 12, wherein the package is made of quartz crystal.

15. The device of claim 12, wherein:
    the package comprises a base supporting the tuning-fork type piezoelectric vibrating piece and a lid bonded to the base; and
    the columnar body includes a base columnar member projecting from the base and a lid columnar member projecting from the lid.

16. The device of claim 15, wherein a gap exists between the base columnar member and the lid columnar member.

17. The device of claim 12, wherein:
    the package comprises a base supporting the tuning-fork type piezoelectric vibrating piece and a lid bonded to the base;
    the columnar body comprises a columnar member projecting from the base; and
    the lid is made of metal.

18. The device of claim 12, wherein:
    the package comprises a frame surrounding the tuning-fork type piezoelectric vibrating piece, a base bonded to one surface of the frame, and a lid bonded to the other surface of the frame; and the columnar body comprises a first columnar member projecting from the base, a second columnar member projecting from the lid toward the first columnar member, and a third columnar member extending from the frame toward the first and second columnar members.

* * * * *

UNITED STATES PATENT AND TRADEMARK OFFICE
CERTIFICATE OF CORRECTION

| | |
|---|---|
| PATENT NO. | : 8,456,065 B2 |
| APPLICATION NO. | : 12/880742 |
| DATED | : June 4, 2013 |
| INVENTOR(S) | : Yoshiaki Amano and Takefumi Saito |

It is certified that error appears in the above-identified patent and that said Letters Patent is hereby corrected as shown below:

In the Specification:

Column 2, line 62, "a elevational section" should read --an elevational section--

Column 3, line 18, "line F-F line" should read --line F-F--

Column 3, line 22, "device" should read --device.--

Column 4, line 41, "as of the" should read --as the--

Column 5, line 16, "44, respectively" should read --44, respectively,--

Column 5, line 19, "base 40" should read --base 40,--

Column 5, line 33, "melts it" should read --melts, it--

Column 5, line 38, "line B-B line" should read --line B-B--

Column 6, line 27, "I. e." should read --I.e.--

Column 6, line 47, "film 25" should read --film 15--

Column 6, line 56, "Piexoelectric Device" should read --Piezoelectric Device--

Column 8, line 12, "lid columnar member 48b" should read --base columnar member 48b--

Column 8, line 29, "line E-E line" should read --line E-E--

Column 10, lines 8-9, "second assistive columnar member 48d" should read --first assistive columnar member 48d--

Column 10, line 11, "the 40D" should read --the base 40D--

Column 11, line 12, "crystal frame 20" should read --crystal frame portion 29--

Column 11, line 13, "x-axis direction." should read --z-axis direction.--

Column 12, line 12, "thorough-holes 42, 43" should read --through-holes 41, 43--

Column 12, line 21, "lid 1 OF" should read --lid 10F--

Column 12, line 25, "the 10F" should read --the lid 10F--

Column 12, line 36, "Pyrex glass" should read --Pyrex® glass--

Signed and Sealed this
Twenty-fifth Day of November, 2014

Michelle K. Lee
*Deputy Director of the United States Patent and Trademark Office*

Column 12, lines 64-65, "dc potential" should read --DC potential--

Column 12, line 65, "is connected" should read --is applied--